United States Patent [19]
Kato et al.

[11] 3,962,860
[45] June 15, 1976

[54] QUARTZ CRYSTAL TIMEPIECE

[75] Inventors: Kotaro Kato, Tokyo; Makoto Morimoto, Chiba, both of Japan

[73] Assignee: Kabushiki Kaisha Daini, Japan

[22] Filed: Aug. 30, 1974

[21] Appl. No.: 502,185

[30] Foreign Application Priority Data
Aug. 31, 1973 Japan.............................. 48-102223

[52] U.S. Cl. ................... 58/23 AC; 310/9.1; 331/116 R
[51] Int. Cl.² ....................... G04C 3/00; H03B 5/30
[58] Field of Search ............ 58/23 R, 23 AC, 23 V; 310/9.1; 331/116 R, 158

[56] References Cited
UNITED STATES PATENTS

| | | |
|---|---|---|
| 3,583,149 | 6/1971 | Ganter.................................. 58/23 |
| 3,748,845 | 7/1973 | Mutter et al........................ 58/23 A |
| 3,757,510 | 9/1973 | Dill ..................................... 58/50 R |
| 3,791,133 | 2/1974 | Hashimura ....................... 58/23 AC |

*Primary Examiner*—Edith Simmons Jackmon
*Attorney, Agent, or Firm*—Robert E. Burns; Emmanuel J. Lobato; Bruce L. Adams

[57] ABSTRACT

A quartz crystal timepiece incorporating a vibrator unit is disclosed. The vibrator unit is hermetically sealed in a case on which a condenser is fixed and the condenser compensates the oscillating frequency of said vibrator unit to a predetermined center frequency by suitably selecting the capacitance of the condenser after measuring the natural frequency of the vibrator unit. Then there is no need to adjust each vibrator unit to the predetermined center frequency during assembling process.

13 Claims, 5 Drawing Figures

QUARTZ CRYSTAL TIMEPIECE

BACKGROUND OF THE INVENTION

This invention relates to a quartz crystal timepiece having a frequency standard unit, more particularly a quartz crystal vibrator is sealed in a case and a passive electronic element such as a condenser, a resistor or etc. is joined with said case.

In a conventional timepiece device using a quartz crystal oscillating circuit, for instance watches or clocks, all the electronic parts which comprise the oscillating circuits are not necessarily incorporated into one unit. Therefore, much time and labor is required during the assembling process or during servicing of the timepiece at repair shops, because there are many electric and terminals to be disconnected and connected. Furthermore there has been a problem in conventional timepieces from the point of arrangement of parts, particularly in modern watches where space is extremely limited.

Generally speaking, the center frequency of mass-produced quartz crystal vibrators are normally distributed around a predetermined resonant frequency. Then the particular oscillating frequency of each vibrator has to be adjusted to a predetermined oscillating frequency by connecting a passive electronic element, for example, a variable capacitor, to said vibrator.

However it is impossible to get a variable condenser which can effectively cover a wide range variation of capacitance, so quartz crystal vibrators having certain narrow ranges of oscillating frequency must be selected for incorporation in a quartz crystal watch. This is one of the reasons why a quartz crystal watch is expensive.

SUMMARY OF THE INVENTION

An object of this invention is to eliminate the above-mentioned defects and to provide an inexpensive quartz crystal timepiece using a vibrator unit.

Another object of this invention is to provide a quartz crystal timepiece having a frequency standard incorporated into one unit thereby eliminating the need to adjust its oscillating frequency.

According to this invention, the natural frequency of a quartz crystal vibrator is easily compensated to the predetermined center frequency, even if its natural frequency is widely distributed over a wide range, by selecting a condenser which has suitable capacitance to compensate said oscillating frequency. Of course, the natural frequency of each vibrator has previously been measured and therefore its value is known.

According to this invention, since the frequency adjustment during the assembling process is eliminated, the workability and space factor of the watch are remarkably increased. Furthermore, since the oscillating unit itself is easily replaced by another unit, it is convenient for after-services at a shop.

The foregoing objects and other objects as well as the characteristic features of the invention will become more apparent and more readily understandable by the following description and the appended claims when read in conjunction with the accompanying drawings.

DETAILED DESCRIPTION OF THE INVENTION

Figure 1:
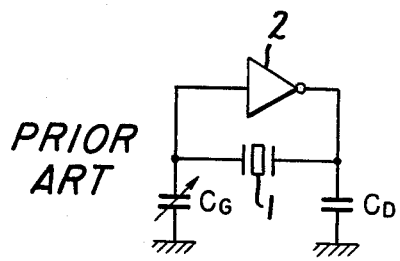
FIG. 1 shows a conventional oscillating circuit.

Now the invention will be explained by referring to the drawings.

FIG. 1 shows a conventional oscillating circuit having a quartz crystal vibrator 1, an invertor circuit 2, and condensers $C_G$ and $C_D$. Deviation of the oscillating frequency of each vibrator around a predetermined center frequency is caused by deviation of the natural frequency of each quartz crystal vibrator and deviation of the value of the other electronic parts thereof.

Despite the fact that deviation of the former is far larger than that of the latter, however, the frequency adjustment of the vibrator itself is so difficult to carry out that the frequency adjustment of the overall oscillating circuit is carried out mainly by adjusting the condensers $C_G$ and/or $C_D$.

Figure 2:
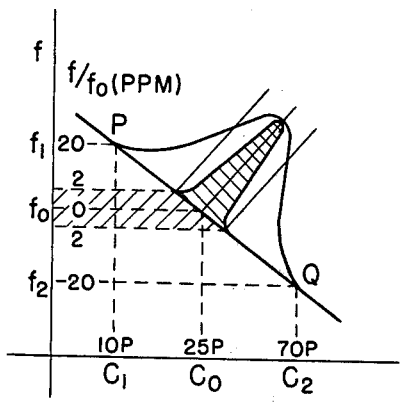
FIG. 2 shows the frequency shift of the oscillating circuit shown in FIG. 1, when the capacitance of condenser $C_G$ or $C_D$ is changed.

FIG. 2 shows the frequency shift of the oscillating circuit shown in FIG. 1 when the capacitance of condenser $C_G$ or $C_D$ is changed. When the capacitance of the condenser $C_G$ is changed, but the capacitance of the condenser $C_D$ is not changed, the value of the resonant frequency of the circuit is shifted along the line $\overline{PQ}$. Likewise, if the capacitance of the condenser $C_D$ is changed and the capacitance of the condenser $C_G$ is not changed, the same effect appears.

As mentioned above, the natural frequency of mass-produced quartz crystal vibrators is normally distributed around a predetermined resonant frequency $f_0$. This distribution is shown on the line $\overline{PQ}$.

For adjusting the resonant frequency of these distributed frequencies to the center frequency $f_0$, the capacitance of both condensers $C_D$ and $C_G$, or the capacitance value of one of them is initially chosen. Then for precisely adjusting these distributed resonant frequencies to the center frequency $f_0$, many condensers having different capacitance values, have to be prepared so that one with the proper value of capacitance can be selected and added to the circuit.

For example, and with reference to FIG. 2, if the natural frequency of a vibrator deviates + 20 p.p.m. from the predetermined center frequency, it will be adjusted to center frequency by joining the condenser $C_2$ having a capacitance of 70 PF.

As explained above, a variable condenser is not needed for the condenser $C_G$, if the other condenser $C_D$ is fixed to some capacitance, and the natural frequency of each vibrator is measured. Then the condenser $C_G$ having a suitable fixed or constant capacitance to compensate the oscillating frequency is selected from the many condensers having different capacitance values. If a variable condenser is used in this circuit, a variable condenser having narrow range can be used.

Figure 3A:
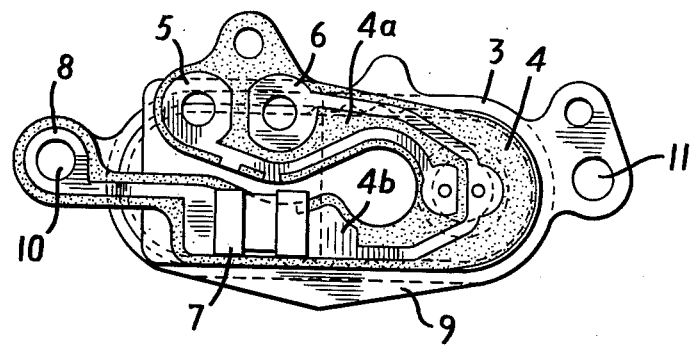
FIG. 3A shows a top plan view of a vibrator unit according to the invention and FIG. 3B shows a side view thereof.
Figure 3B:
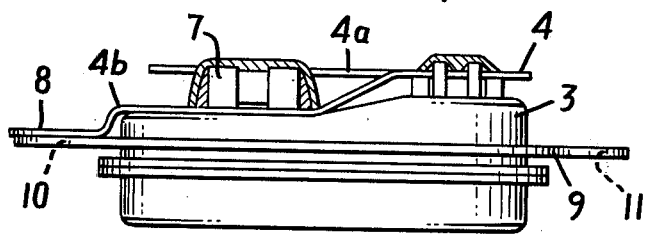

FIG. 3 shows a vibrator unit constructed according to the principles of the invention. The condenser 7 selected by the above process 1 is fixed on a printed circuit board 4 having forks 4a and 4b and the board is fixed to a case 3 incorporating a quartz crystal vibrator.

The fork 4b having the condenser 7 and a terminal 8 is bent along and extends along the upper surface of the case 3. On the other hand, the fork 4a has terminals 5 and 6. These terminals are available for connecting to other electronic circuits (not shown). Thus a compact vibrator unit is formed which is mounted on a supporting board 9 having holes 10 and 11.

Figure 4:
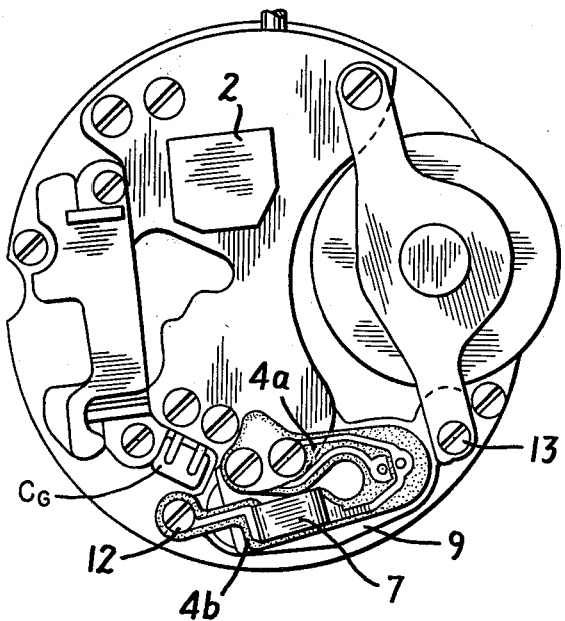
FIG. 4 shows a top plan view of a watch movement incorporating a vibrator unit of the invention.

This unit is fixed on a watch movement by screws 12 and 13 which are shown in FIG. 4.

The invention can be modified within the range which does not constitute departure from the spirit and scope of the invention as set forth in the appended claims.

We claim:

1. A coarsely adjusted quartz crystal vibrator package for use in quartz crystal timepieces comprising: a case having sealed therein a quartz crystal vibrator having its own natural oscillating frequency; and means connected to said case and defining therewith a quartz crystal vibrator package for coarsely compensating for deviation of the natural oscillating frequency of said quartz crystal vibrator from a predetermined time-base standard oscillating frequency thereby providing a coarsely adjusted quartz crystal vibrator package for use in quartz crystal timepieces.

2. A coarsely adjusted quartz crystal vibrator package according to claim 1; wherein said means for coarsely compensating comprises a passive electronic element.

3. A coarsely adjusted quartz crystal vibrator package according to claim 2; wherein said passive electronic element comprises a condenser having a capacitance value suitably selected so as to coarsely compensate for frequency deviation of the natural oscillating frequency of said quartz crystal vibrator from said predetermined time-base standard oscillating frequency.

4. A coarsely adjusted quartz crystal vibrator package according to claim 1; wherein said means for coarsely compensating comprises a printed circuit board connected to said case and being in electric contact therewith, and a passive electronic element removably and replaceably mounted on said printed circuit board and being suitably selected so as to coarsely compensate for frequency deviation of the natural oscillating frequency of said quartz crystal vibrator from said predetermined time-base standard oscillating frequency thereby enabling easy coarse adjustment of the oscillating frequency of said quartz crystal vibrator package by simply removing and replacing said passive electronic element with another one having a different value.

5. A coarsely adjusted quartz crystal vibrator package according to claim 4; wherein said passive electronic element comprises a condenser having a capacitance value suitable selected so as to coarsely compensate frequency deviation of the natural oscillating frequency of said quartz crystal vibrator from said predetermined time-base standard oscillating frequency.

6. A coarsely adjusted quartz crystal vibrator package according to claim 4; wherein said case has pins connected thereto and projecting therefrom, and said printed circuit board is connected to said pins.

7. A coarsely adjusted quartz crystal vibrator package according to claim 4; wherein said printed circuit board has a generally forked shape with one fork being connected to said passive electronic element and extending along and lying in electric contact with a surface portion of said case.

8. A coarsely adjusted quartz crystal vibrator package according to claim 7; wherein the other fork of said forked shape terminates in electric terminals for connection to other electronic circuits during use of the quartz crystal vibrator package in a timepiece.

9. In a quartz crystal timepiece: a timepiece casing; and a coarsely adjusted quartz crystal vibrator package removably and replaceably mounted within said timepiece casing and comprised of a case having sealed therein a quartz crystal vibrator having its own natural oscillating frequency, and means connected to said case and defining therewith said package and including a passive electronic element for coarsely compensating for deviation of the natural oscillating frequency of said quartz crystal vibrator from a predetermined time-base standard oscillating frequency.

10. A quartz crystal timepiece according to claim 9; wherein said means for coarsely compensating comprises a printed circuit board connected to said case and being in electric contact therewith, and a passive electronic element removably and replaceably mounted on said printed circuit board and being suitable selected so as to coarsely compensate for frequency deviation of the natural oscillating frequency of said quartz crystal vibrator from said predetermined time-base standard oscillating frequency thereby enabling easy coarse adjustment of the oscillating frequency of said quartz crystal vibrator package by simply removing and replacing said passive electronic element with another one having a different value.

11. A quartz crystal timepiece according to claim 10; wherein said passive electronic element comprises a condenser having a capacitance value suitably selected so as to coarsely compensate frequency deviation of the natural oscillating frequency of said quartz crystal vibrator from said predetermined time-base standard oscillating frequency.

12. A quartz crystal timepiece according to claim 10; wherein said case has pins connected thereto and projecting therefrom, and said printed circuit board is connected to said pins.

13. A quartz crystal timepiece according to claim 10; wherein said printed circuit board has a generally forked shape with one fork being connected to said passive electronic element and extending along and lying in electric contact with a surface portion of said case.

* * * * *